(12) United States Patent
Miller

(10) Patent No.: US 6,614,870 B1
(45) Date of Patent: Sep. 2, 2003

(54) MULTI-MODULUS PRESCALER WITH SYNCHRONOUS OUTPUT

(75) Inventor: Brian M. Miller, Liberty Lake, WA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/210,588

(22) Filed: Jul. 31, 2002

(51) Int. Cl.[7] .............................................. H03K 21/00
(52) U.S. Cl. ...................................................... 377/48
(58) Field of Search ............................................ 377/48

(56) References Cited

U.S. PATENT DOCUMENTS 6,501,815 B1 * 12/2002 Stansell ........................ 377/47
6,501,816 B1 * 12/2002 Kouznetsov .................. 377/48

* cited by examiner

*Primary Examiner*—Margaret R. Wambach
(74) *Attorney, Agent, or Firm*—Robert T. Martin

(57) ABSTRACT

A multi-modulus prescaler with a terminal count request input, which when set causes the prescaler to produce an output pulse with edges synchronous with the input clock. The prescaler is driven by a control circuit which produces a terminal count request output which enables the prescaler to generate a terminal count output pulse whose active edge, irrespective of the divide ratio, is always a fixed number of input clock cycles before or after the end of the prescaler control cycle.

7 Claims, 6 Drawing Sheets

MULTI-MODULUS PRESCALER WITH SYNCHRONOUS OUTPUT

BACKGROUND OF THE INVENTION

1. Field of the Invention

The present invention pertains to the art of frequency dividers. More particularly, it pertains to multi-modulus prescalers.

2. Art Background

There are many methods employed to generate a signal at a specified frequency. Within the field of frequency synthesis a circuit function known as a frequency divider is often used. The output of a frequency divider is less than its input frequency by some factor N. The divider is typically a digital circuit and the input and output waveforms are pulse trains at frequencies of Fc and Fc/N respectively. The modulus of this divider is 'N.'

It is often desirable to have a frequency divider which is not constrained to a single divide ratio, N, for example a divider which can divide by any number between 50 and 100. Creating such a divider from combinatorial logic and flip-flops is difficult. A more elegant technique involves the use of a multi-modulus prescaler.

Frequency dividers are widely employed in Phase Locked Loops (PLLs). PLLs are well known to the art. In general, the signal from a high frequency oscillator is divided down and compared to a lower frequency reference signal. The error signal from this comparison is filtered and used as a control signal to alter the frequency of the high frequency oscillator. Thus the PLL locks the fluctuations of a noisy high frequency oscillator to those of a quiet reference signal. This is accomplished in part by using a frequency divider (called an N-divider) to divide down the high frequency oscillator by some value 'N' and then comparing this divided down signal to that of the reference signal. The PLL output frequency is 'N' times the reference frequency.

Multi-modulus prescalers are often employed in frequency dividers. Dual modulus prescalers divide by two factors, for example, ¾. Other multi-modulus prescalers are capable of more divisors, such as 8/9/12/13 or 16/17/20/21. The prescaler modulus is selected by a prescaler control circuit. The prescaler control circuit is programmed with the desired divide number, controls the modulus of the prescaler as a function of time, and produces an output pulse when the desired count is obtained. This output pulse is often called 'terminal count'.

Many applications are concerned with phase noise and want the prescaler based N-divider to have the lowest possible phase noise. One source of phase noise is jitter in the active edge of the prescaler's terminal count pulse. This jitter is a result of signal-to-noise ratios and switching speed limitations within the prescaler control circuit and the prescaler.

What is needed is a way to reduce jitter and its resultant phase noise in prescaler based N-dividers.

SUMMARY OF THE INVENTION

Jitter is reduced in a multi-modulus prescaler N-divider by providing the prescaler with a terminal count request input, which when set causes the prescaler to produce an output pulse with edges synchronous with the input clock. The prescaler is driven by a control circuit which produces a terminal count request output which enables the prescaler to generate a terminal count output pulse whose active edge, irrespective of the divide ratio, is always a fixed number of input clock cycles before or after the end of the prescaler control cycle.

BRIEF DESCRIPTION OF THE DRAWINGS

The present invention is described with respect to particular exemplary embodiments thereof and reference is made to the drawings in which.

DETAILED DESCRIPTION

Figure 1:
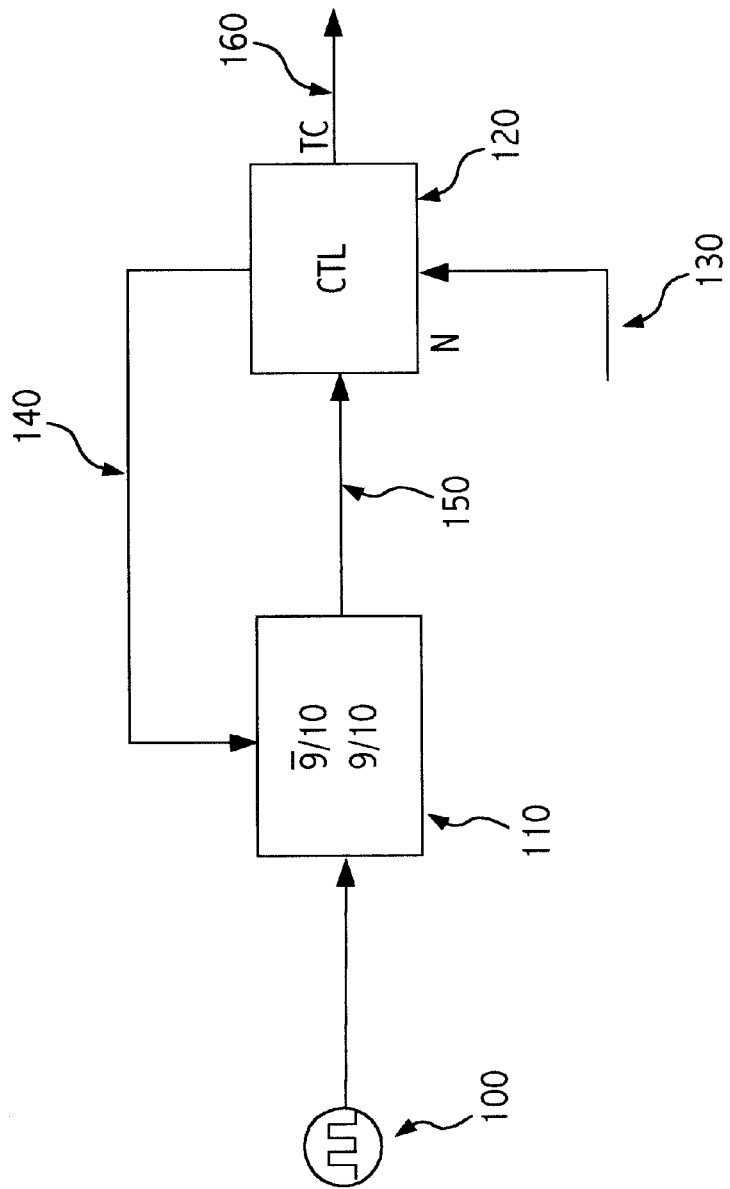
FIG. 1 shows a Prescaler and Prescaler control circuit as known to the art.

FIG. 1 illustrates an N-divider constructed from a 9/10 dual modulus prescaler and a prescaler control circuit. Input signal 100 is fed to 9/10 prescaler 110. Prescaler 110 is controlled by prescaler control 120. Input 130 to prescaler control 120 is the divide number, N. In operation, prescaler 110 is controlled by modulus control signal 140. When modulus control signal 140 is high for example, prescaler 110 emits one output pulse for every 10 input pulses. When modulus control signal 140 is low, prescaler 110 emits one output pulse for every 9 input pulses. Prescaler output 150 is fed to prescaler control 120 which determines when to emit terminal clock (TC) pulse 160.

Consider the case where the desired divide number, N, is 113. The value of N is sent 130 to prescaler control circuit 120. Prescaler control circuit 120 determines that a count of 113 can be achieved via 7 prescaler counts in divide-by-9 mode plus 5 prescaler counts in the divide-by-10 mode: 7*9+5*10=113. Prescaler control circuit design is well known to the art.

In the example of FIG. 1, prescaler 110 must operate at Fc, the full clock frequency. Prescaler control circuit 120 does not operate as fast as prescaler 110. In this example prescaler control circuit 120 operates at Fc/9. Terminal count output pulse 160 is generated by prescaler control circuit 120, not prescaler 110.

Many applications are concerned with phase noise and want the prescaler based N-divider to have the lowest possible phase noise. Phase noise is introduced by the divider via jitter in the terminal count active edge. The active edge may be a rising or a falling edge depending on the implementation. The jitter is a result of signal-to-noise ratios and switching speed limitations within the prescaler control circuit and the prescaler. Noise degradation can be reduced by reclocking the terminal count (TC) pulse with the input signal. The re-clocking operation is a simple sampling of TC by the input signal which results in the removal of jitter added by the prescaler and prescaler control circuit.

Figure 2:
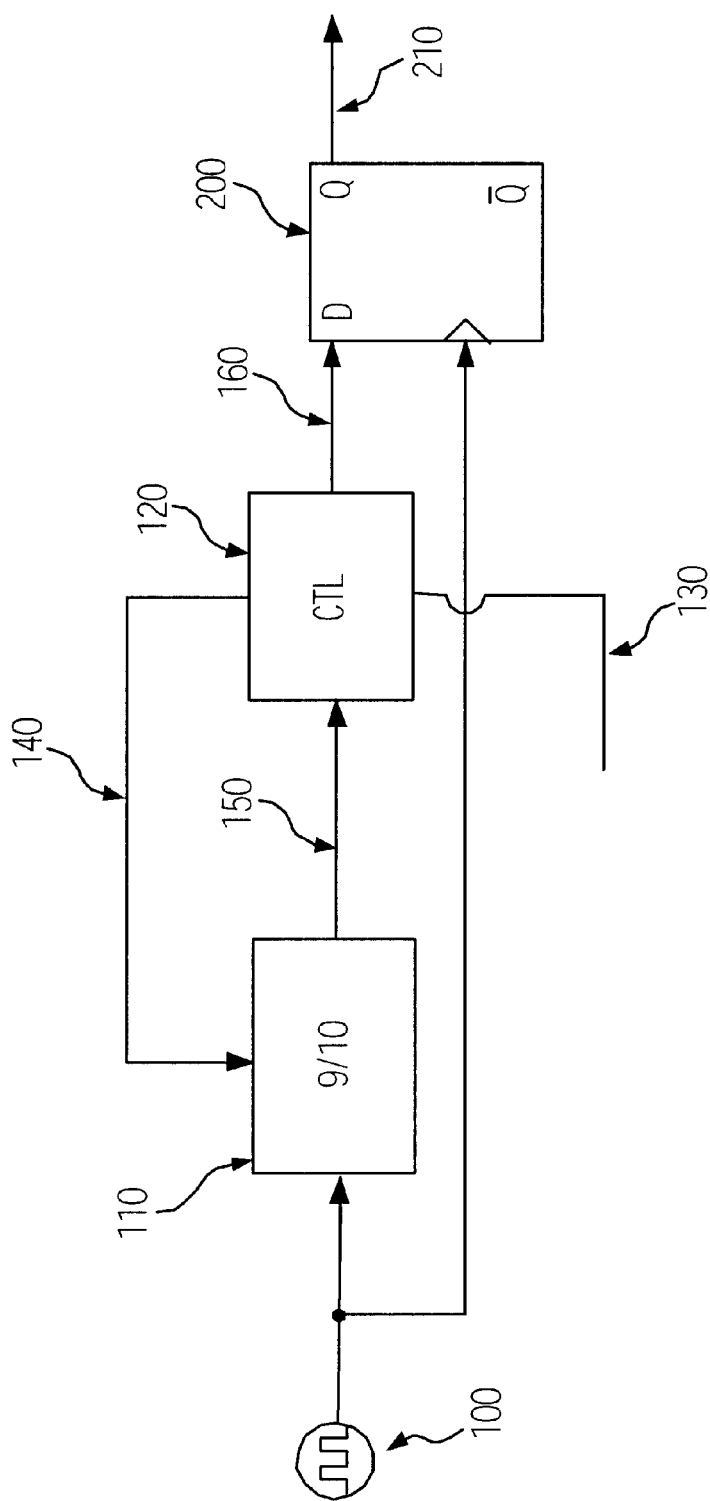
FIG. 2 shows a reclocking circuit.

Reclocking the terminal count output is a common practice in frequency synthesis. Unfortunately, reclocking becomes problematic at high input frequencies because of delays in the reclocking path. Referring to FIG. 2, D flip-flop 200 reclocks terminal count output 160 of prescaler control 120 to the input signal. Note that there is a delay between input signal 100 and prescaler output 150, and a delay between prescaler output 150 at prescaler control circuit 120 and Terminal Count output 160. If the path delay is such that Terminal Count 160 edge is concurrent with the reclocking edge of input signal 100, the reclocking operation will fail. This limits the applicability of such reclocking techniques, especially at very high frequencies.

The present invention is a method to obtain reclocking of the terminal count pulse. The invention is not limited by path delays between the multi-modulus prescaler and the prescaler control circuit. The invention allows reclocking at rates as high as the prescaler's maximum input frequency.

Multi-modulus prescalers can be designed according to the present invention so that their output pulses are synchronous with the input clock. The active edge of the output pulse is reclocked by the input signal.

Figure 3:
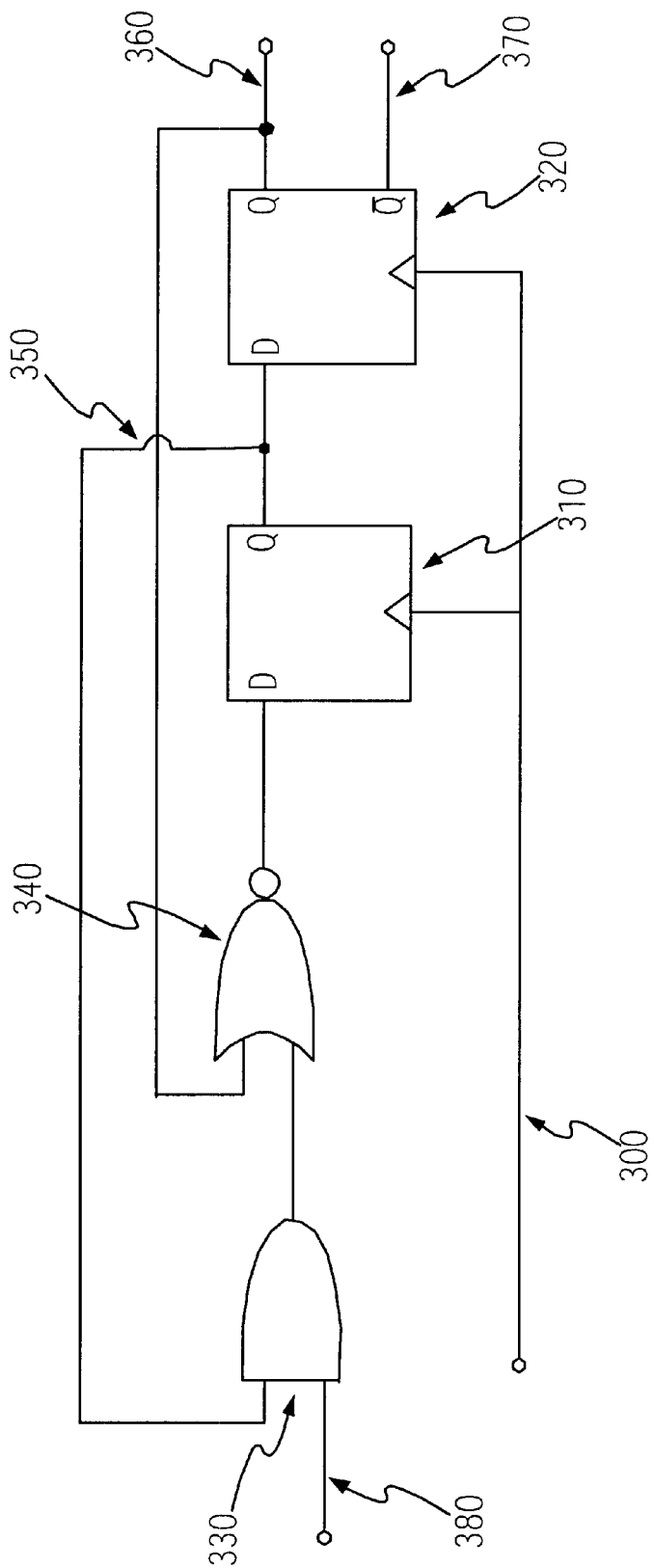
FIG. 3 shows a ¾ prescaler as known to the art.

FIG. 3 is a simplified diagram of a ¾ prescaler, now obsolete, formerly manufactured by Plessey Semiconductor as the SP8720. Input signal 300 drives clock inputs of D flip-flops 310 and 320. Prescaler output 360 and its compliment 370 are taken from D flip-flop 320. Modulus control is provided by AND gate 330 and NOR gate 340. Input 380 is the modulus control, low to divide by 4 and high to divide by 3.

Note that the output is derived from D-flip-flop 320 which is clocked by input signal 300. Transitions in outputs 360 and 370 will be synchronous with input 300. The output pulses of the prescaler become the clock for the prescaler control circuit. The prescaler control circuit (not shown in FIG. 3) counts the number of prescaler output pulses and determines when to change the modulus and when to produce the terminal count output pulse.

Referring back to FIG. 1, terminal count pulse 160 produced by the prescaler control circuit 120, is not synchronous with input 100. Its exact timing is dependent on delay between prescaler 110 and prescaler control circuit 120 and on propagation delays in prescaler control circuit 120. It may also be affected by supply noise and signal coupling within prescaler control circuit 120. All of this will contribute to a degradation in phase noise of terminal count pulse 160. Because prescaler control circuit 120 runs at a slower rate than prescaler 110, its circuitry will not support transitions as fast as prescaler 110, which may also lead to degraded phase noise.

Figure 4:
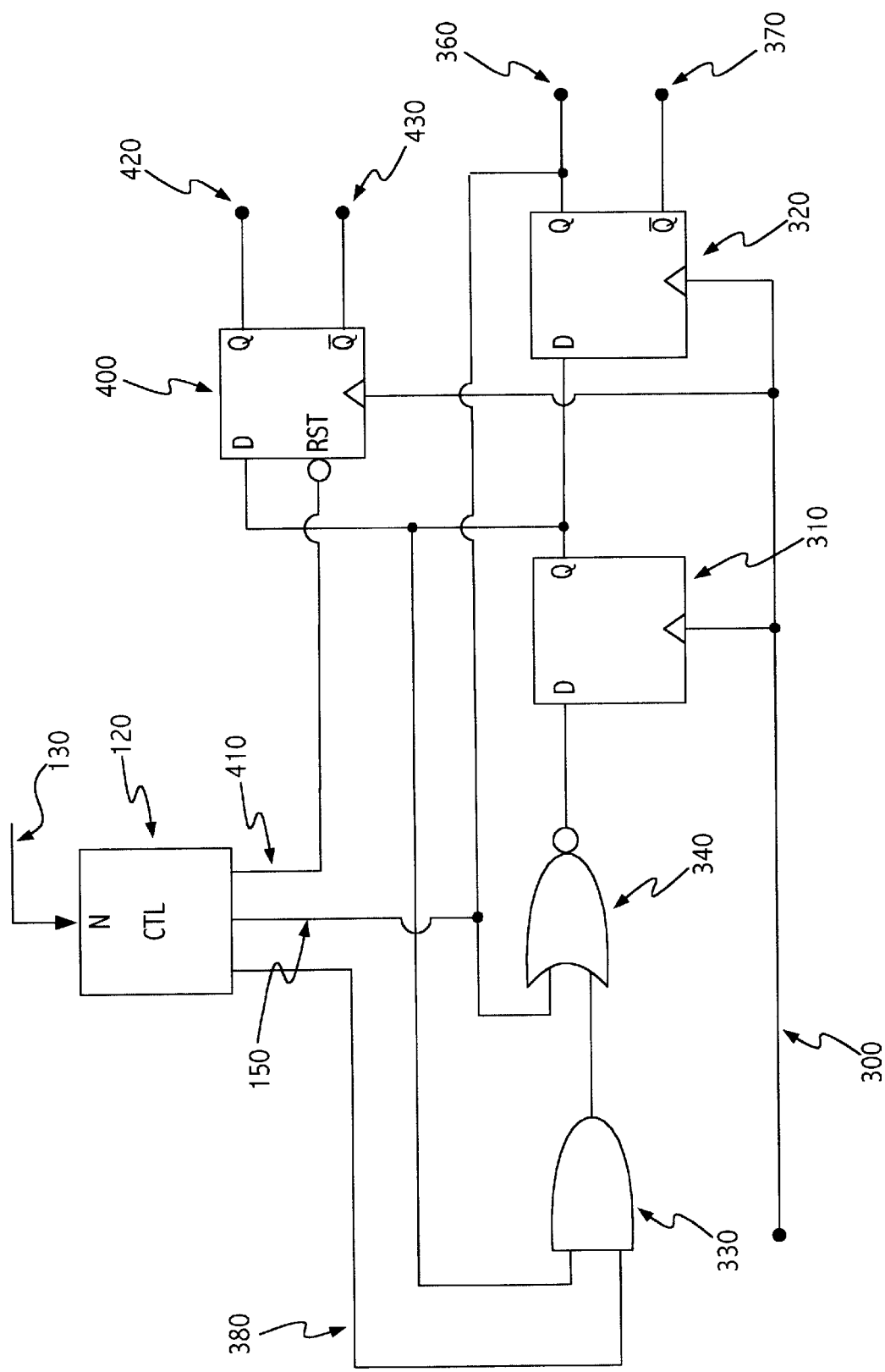
FIG. 4 shows a Prescaler according to the present invention.

According to the present invention, an embodiment of which is shown in FIG. 4, a synchronized terminal count output pulse 420 can be obtained by having the prescaler control circuit 120 send a terminal count request 410 to the prescaler. The prescaler controller has the knowledge of when the terminal count will occur, from counting pulses on prescaler output 360 which is connected to prescaler control input 150. Prescaler controller 120 selects the modulus for the prescaler via modulus control line 380. The divisor, N, is input to controller 120 as input 130. Prescaler controller 120 passes terminal count request 410 to the prescaler, thus enabling the prescaler to generate the terminal count pulse.

In FIG. 4, D flip-flop 400 is clocked by input signal 300, as are flip-flops 310 and 320. Terminal Count request line 410 line is held low (set to 0) by prescaler control circuit 120 for all but the final modulus control update. Terminal Count request line 410 is asserted (set to 1) concurrent with the final modulus control period of the prescaler control cycle. This enables D flip-flop 400 and allows the last prescaler pulse to appear on the Terminal Count output 420, and its compliment on output 430. Since D flip-flop 400 is clocked by input 300, Terminal Count output 420 pulse is synchronous with input 300. The period between two terminal count request line assertions is one prescaler control cycle.

Provisions must be made to insure that Terminal Count request 410 does not enable the Terminal Count output prematurely. It may be necessary to latch modulus control 380 and Terminal Request 410. Also, it should be noted that there are ways other than using the preset/reset (set or clear) inputs of a flip flop for the purpose of generating the Terminal Count output which are known to practitioners of the art.

The present invention generates a terminal count output pulse with edges synchronous with the input clock. The prescaler control circuit produces a terminal count request output which enables the prescaler to generate a terminal count output pulse whose active edge, irrespective of the divide ratio, is always a fixed number of input clock cycles before or after the end of the prescaler control cycle. The active edge, rising or falling, of the terminal count output pulse always occurs a fixed number of input clock cycles before or after the end of the prescaler control cycle, independent of the divide ratio N. It is not a requirement that the terminal count output pulse be of a constant width.

Figure 5:
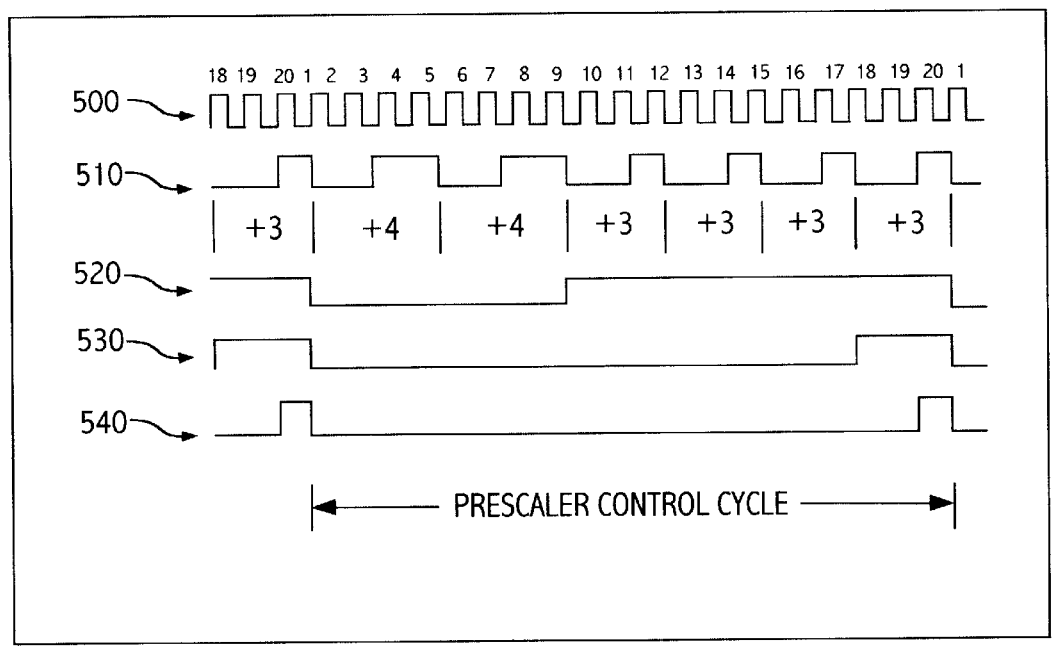
FIG. 5 shows a first timing diagram of a Prescaler according to the present invention.
Figure 6:
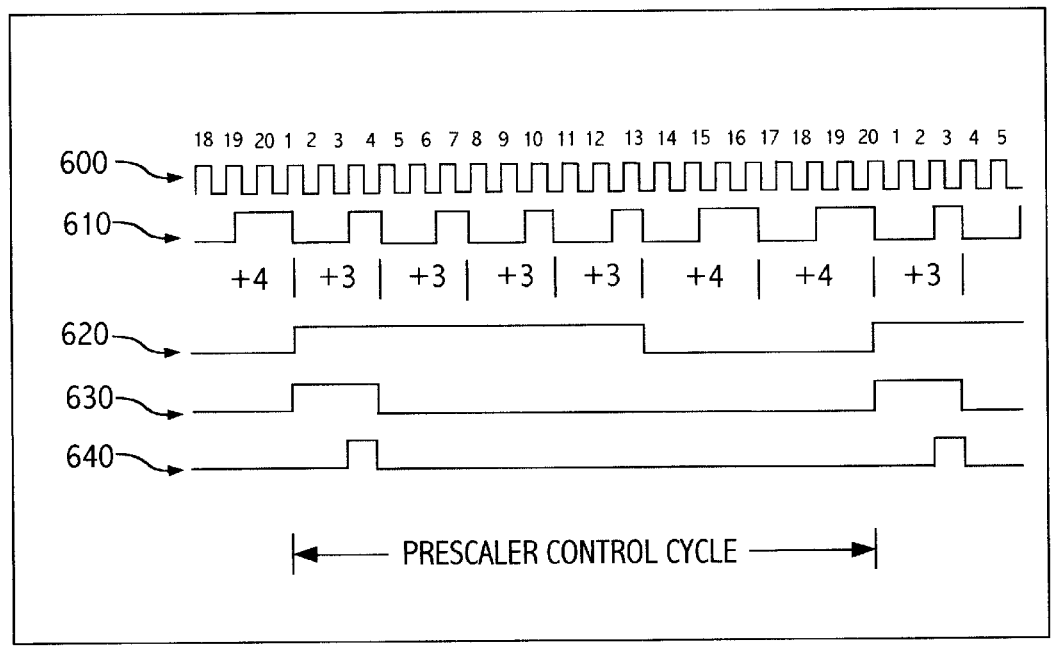
FIG. 6 shows a second timing diagram of a Prescaler according to the present invention.

This is shown in the timing diagrams of FIGS. 5 and 6, showing a ¾ prescaler used to achieve a divide number of 20. A count of 20 is obtained as 2*4+4*3, 2 prescaler pulses at divide-by-4, and 4 prescaler pulses at divide-by-3. FIG. 5 shows the terminal count request when the base modulus is at the end of the prescaler control cycle. Input clock 500 is fed to input 300 of the embodiment shown in FIG. 4. prescaler output waveform 510 is produced at output 360 of FIG. 4. Modulus control input 520 from the Prescaler controller is applied to input 380 of FIG. 4. Terminal count request 530 from the Prescaler controller drives input 410 of FIG. 4. Terminal count output 540 is produced at output 420 of FIG. 4. In this example, terminal count output 540 is one cycle of input clock 500 in width. The active edge of terminal count output 540 is the rising edge, and in this case leads the end of the prescaler control cycle by one cycle of input clock 500.

FIG. 6 shows the terminal count request when the base modulus is at the beginning of the Prescaler control cycle. Input clock 600 is fed to input 300 of the embodiment shown in FIG. 4. Prescaler output waveform 610 is produced at output 360 of FIG. 4. Modulus control input 620 from the Prescaler controller is applied to input 380 of FIG. 4. Terminal count request 630 from the prescaler controller drives input 410 of FIG. 4. Terminal count output 640 is produced at output 420 of FIG. 4. In this case the active edge of terminal count output 540 is also the rising edge. In this case the active edge lags the end of the prescaler control cycle by two cycles of input clock 500.

Figure 7:
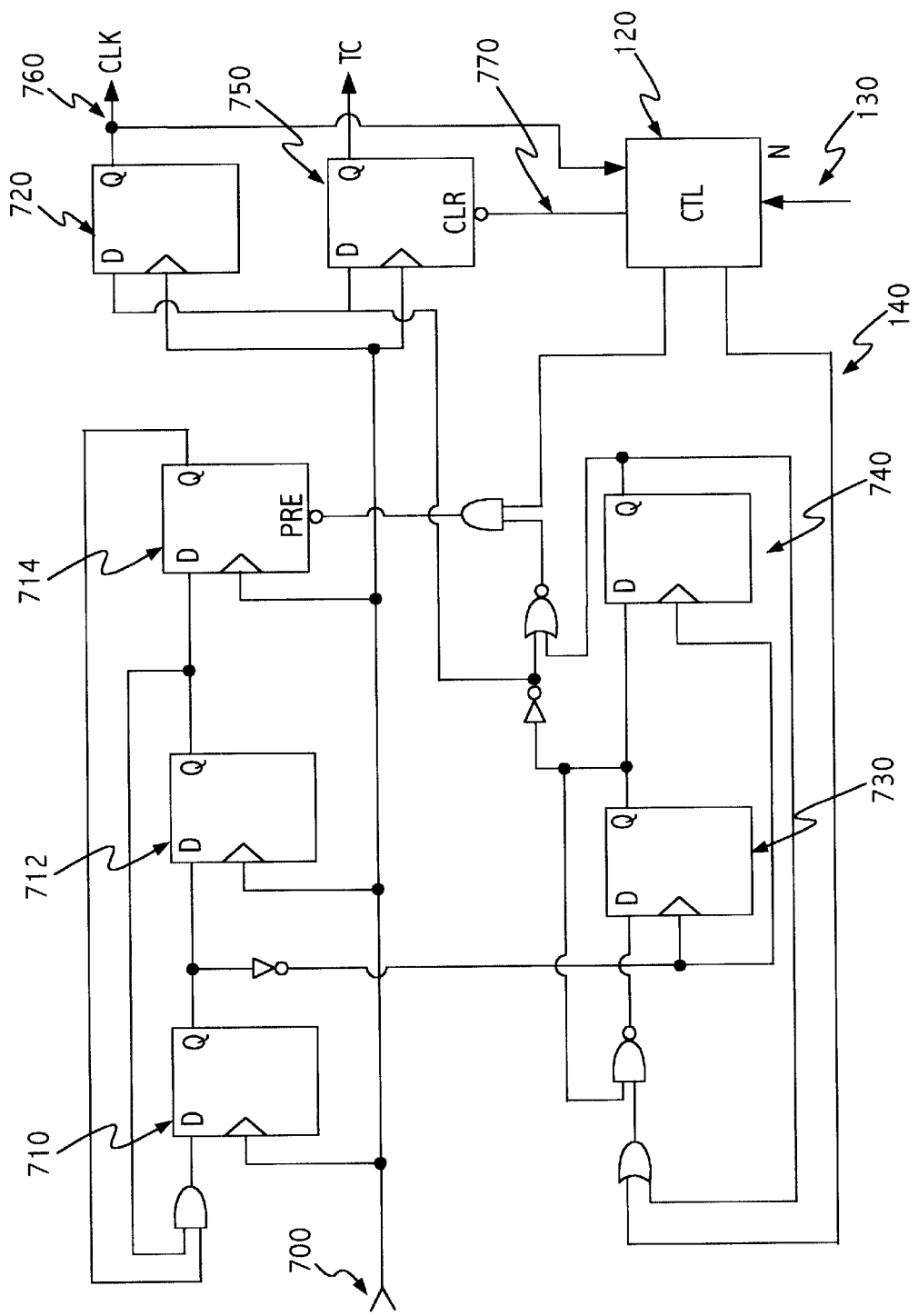
FIG. 7 shows a second embodiment of a Prescaler according to the present invention.

FIG. 7 shows a second embodiment of a prescaler according to the present invention, showing a prescaler with selectable modulus 8/9/12/13. Input signal 700 drives flip-flops 710, 712, 714 which perform either a divide by 8 or divide by 9 depending on the state of modulus select lines 140 and 150. Flip-flops 730 and 740 provide a divide by 4 or 5. The combination provides divide by 8/9/12/13 on output 760 of flip-flop 720. Based on the divide ratio N on input 130, prescaler controller 120 counts pulses on clock like 760, manipulates modulus select lines 140 and 150, and sets terminal count request line 770 to flip-flop 750, which produces terminal count output 750 synchronous with input signal 700.

The invention has been illustrated with a ¾ dual modulus prescaler and a 8/9/12/13 multi-modulus prescaler, the invention is equally applicable to multi-modulus prescalers of other ratios.

The foregoing detailed description of the present invention is provided for the purpose of illustration and is not intended to be exhaustive or to limit the invention to the precise embodiments disclosed. Accordingly the scope of the present invention is defined by the appended claims.

What is claimed is:

1. A multi-modulus prescaler for use with a prescaler controller, the multi-modulus prescaler comprising:

input means for receiving an input clock, modulus select means for receiving a divide modulus from the prescaler controller, count output means for communicating the modulus count to the prescaler controller, terminal count request means asserted by the prescaler controller, and terminal count output means which in conjunction with the terminal count request means generates a terminal count output pulse with an active edge synchronous with the input clock.

2. The multi-modulus prescaler of claim 1 where the modulus select means comprises a single input line.

3. The multi-modulus prescaler of claim 1 where the modulus select means comprises a plurality of input lines.

4. The multi-modulus prescaler of claim 1 where the terminal count output means is clocked directly by the input clock.

5. The multi-modulus prescaler of claim 1 where the active edge of the terminal count output pulse is a fixed number of input clock cycles before or after the end of the prescaler control cycle.

6. The multi-modulus prescaler of claim 5 where the active edge of the terminal count output pulse is the rising edge.

7. The multi-modulus prescaler of claim 5 where the active edge of the terminal count output pulse is the falling edge.

* * * * *